United States Patent [19]

Imaeda et al.

[11] Patent Number: 5,506,439
[45] Date of Patent: Apr. 9, 1996

[54] BIPOLAR TRANSISTOR WITH TEMPERATURE DETECTING TERMINAL

[75] Inventors: Yasuo Imaeda; Hitoshi Iwata; Kenichi Kinoshita, all of Aichi, Japan

[73] Assignee: Kabushiki Kaisha Tokai Rika Denki Seisakusho, Aichi, Japan

[21] Appl. No.: 925,201

[22] Filed: Aug. 6, 1992

[30] Foreign Application Priority Data

Aug. 7, 1991 [JP] Japan ................... 3-062321 U

[51] Int. Cl.$^6$ ............ H01L 31/058; H01L 27/082; H01L 27/102; H01L 29/70
[52] U.S. Cl. ................... 257/467; 257/566
[58] Field of Search ................... 257/467, 566

[56] References Cited

U.S. PATENT DOCUMENTS

| | | | |
|---|---|---|---|
| 2,932,714 | 4/1960 | Merrill | 257/467 |
| 3,219,843 | 11/1965 | Follett | 257/467 |
| 3,275,912 | 9/1966 | Kunz | 257/566 |
| 3,308,271 | 3/1967 | Hilbiber | 257/467 |
| 3,951,693 | 4/1976 | Fisher et al. | 257/566 |

OTHER PUBLICATIONS

Sedra et al, *Microelectronic Circuits*, pp. 411–413 and 512–513, 1987.

*Primary Examiner*—Sara W. Crane
*Assistant Examiner*—Stephen D. Meier
*Attorney, Agent, or Firm*—Finnegan, Henderson, Farabow, Garrett & Dunner

[57] ABSTRACT

An object of this invention is to make it possible to directly monitor a temperature of a transistor chip. According to the present invention, $p^-$ region is formed on a substrate of a $p^+$ layer by epitaxial growth. A first n-type diffusion layer which is a base region, and a second n-type diffusion layer which forms a temperature detecting element are formed in the $p^-$ region. A first $p^+$ diffusion layer which is an emitter region is formed in the first n-type diffusion layer, while a second $p^+$ diffusion layer which forms the temperature detecting element is formed in the second n-type diffusion layer. The temperature detecting element is operated in the active region, so that a characteristic free from variations in collector potential is obtained for the base-emitter potential difference of the temperature detecting element and the temperature of the junction thereof. Owing to this characteristic, the temperature of the junction can be detected from the base-emitter potential difference of the temperature detecting element during operation of the transistor.

4 Claims, 2 Drawing Sheets

BIPOLAR TRANSISTOR WITH TEMPERATURE DETECTING TERMINAL

BACKGROND OF THE INVENTION

This invention relates to a bipolar transistor which is so designed that a terminal voltage of a temperature detecting element built in a transistor chip is detected thereby to monitor heat generated by the chip itself.

In order to prevent a transistor from being heated excessively, the following methods have been employed in the art. In one of the methods, a forward voltage of a diode in an integrated circuit is monitored. In another method, a temperature sensing element such as a posistor is coupled to a heat sink mounted on a transistor, and a variation in resistance of the heat sensing element is detected to measure a temperature of the heat sink. In this method, a temperature of the heat sink is monitored in the above-described manner thereby to indirectly detect the heat generating condition of the transistor.

However, the above-described method is disadvantageous for the following reasons. In practice, an actual temperature of the junction of the transistor is different from the temperature detected by the temperature sensing element. Therefore, the temperature thus detected must be corrected. Furthermore, in the method, the generation of heat at the junction of the transistor is not directly monitored. Therefore, if heat is suddenly generated at the junction, the protective circuit cannot respond to it.

SUMMARY OF THE INVENTION

Accordingly, an object of this invention is to provide a bipolar transistor having a temperature detecting terminal which is so designed that a temperature of the transistor chip itself can be directly monitored.

The foregoing object of the invention has been achieved by the provision of a bipolar transistor with a temperature detecting terminal which, according to the invention, comprises: a substrate having a p$^-$ region which is formed on a p$^+$ region by epitaxial growth; a first n-type diffusion layer formed, as a base region, in the p$^-$ region; a second n-type diffusion layer formed in the p$^-$ region, the second n-type diffusion layer forming a temperature detecting element; a first p$^+$ diffusion layer formed, as an emitter region, in the first n-type diffusion layer; and a second p$^+$ diffusion layer formed in the second n-type diffusion layer, the second p$^+$ diffusion layer forming the temperature detecting element, a temperature being detected from a potential difference between the second n-type diffusion layer and the second p$^+$ diffusion layer.

The temperature detecting element is operated in the active region, so that, even when the collector potential changes, a characteristic as shown in FIG. 4 is established between the base-emitter potential difference of the temperature detecting element and the temperature of the junction. Hence, the temperature of the junction can be detected from the base-emitter potential difference of the temperature detecting element during operation of the transistor.

BRIEF DESCRIPTION OF THE DRAWING(S)

DETAILED DESCRIPTION OF THE PREFERRED EMBODIMENT

Figure 1:
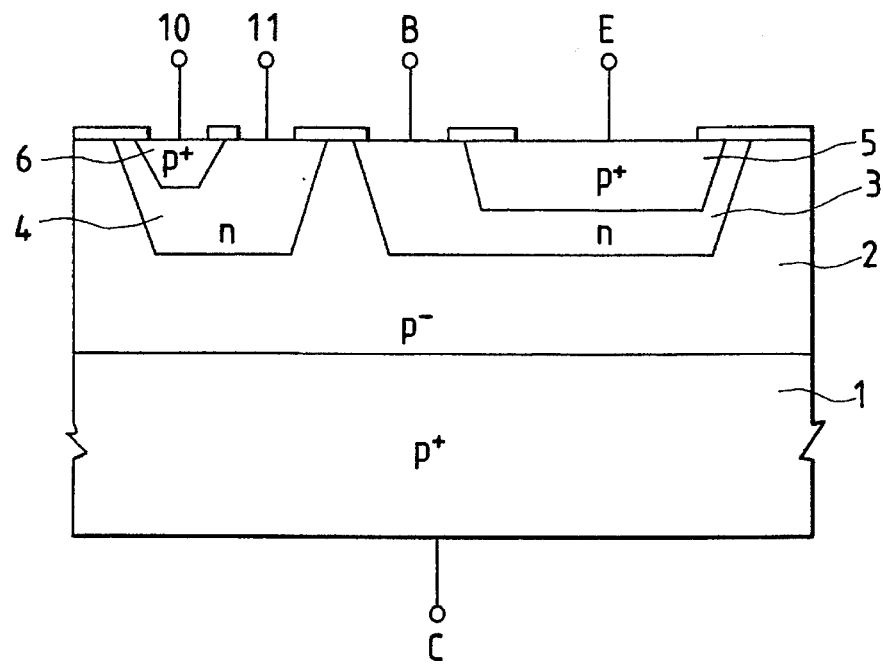
FIG. 1 is a sectional view showing the structure of a bipolar transistor having a temperature detecting terminal according to this invention.

One preferred embodiment of this invention will be described. FIG. 1 is a sectional view showing the structure of a bipolar transistor having a temperature detecting terminal according to the invention (hereinafter referred to merely as "a transistor", when applicable). As shown in FIG. 1, a large region of a first n-type diffusion layer 3 which is the base region of a transistor Tr1, and a small region of a second n-type diffusion layer 4 which is the base region of a temperature detecting transistor Tr2 are formed in a collector region, namely, a p$^-$ layer 2 which is formed on a substrate, namely, a p$^+$ layer 1 by epitaxial growth. A p$^+$ diffusion layer 5 which is the emitter region of the transistor Tr1 is formed in the first n-type diffusion layer 3, and a p$^+$ type diffusion layer 6 which is the emitter region of the temperature detecting transistor Tr2 is formed in the n-type diffusion layer 4.

Figure 2:
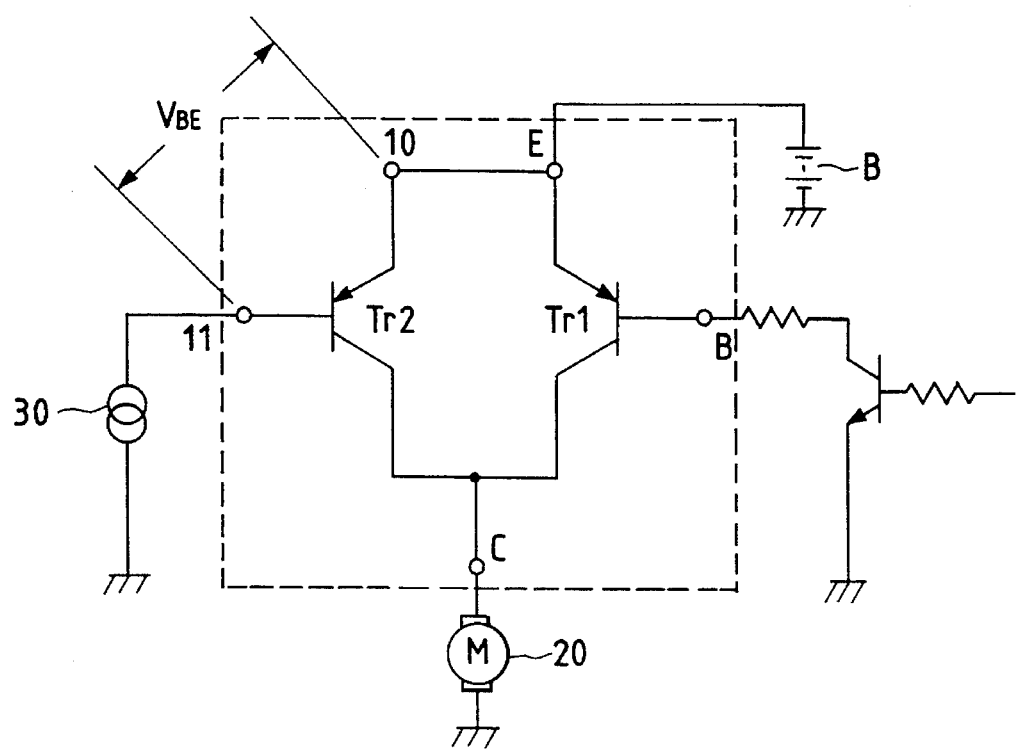
FIG. 2 is a circuit diagram showing an application of the bipolar transistor according to the invention.
Figure 3:
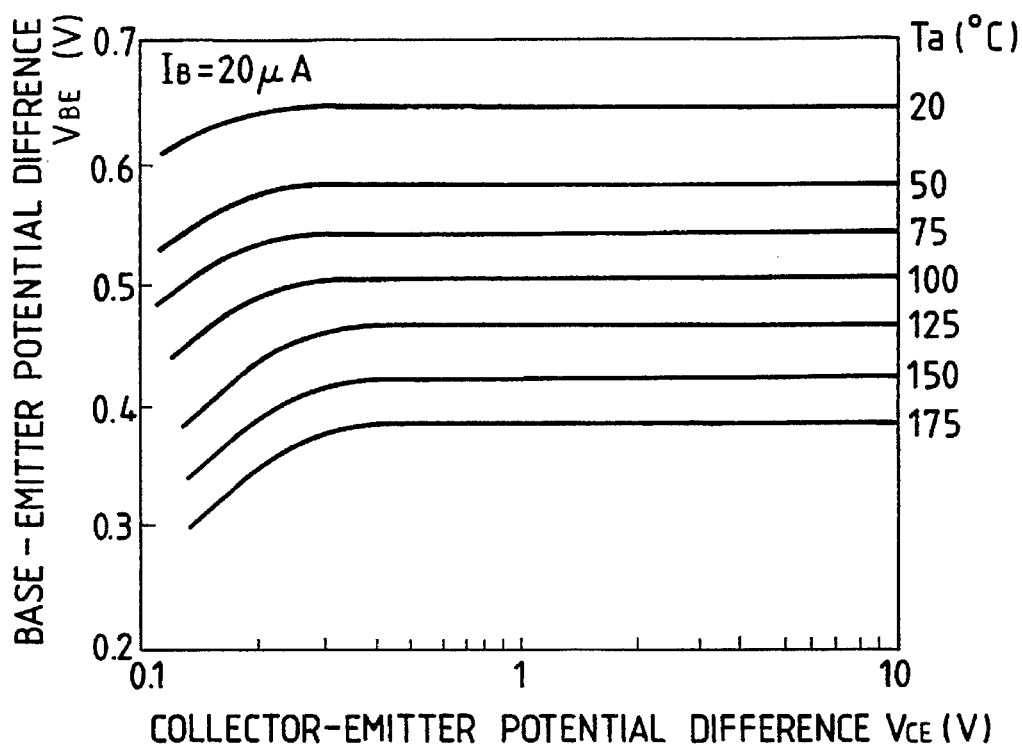
FIG. 3 is a graphical representation indicating variations in $V_{BE}$ and in $V_{CE}$ with ambient temperatures as parameters.
Figure 4:
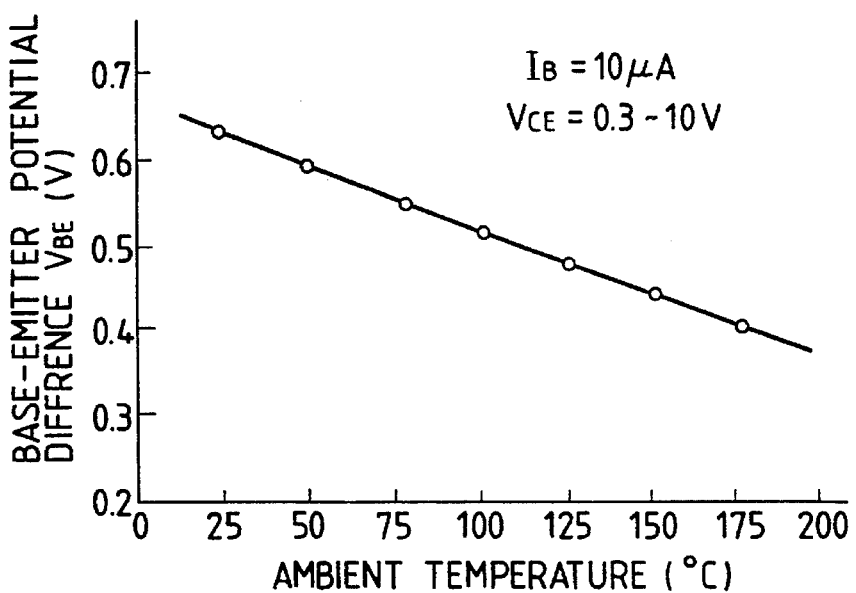
FIG. 4 is a graphical representation indicating ambient temperatures with base-emitter voltages $V_{BE}$.

FIG. 2 is a circuit diagram showing one application of the transistor according to the invention. FIG. 3 is a characteristic diagram indicating potential differences $V_{BE}$ between the emitter 10 and the base 11 of the transistor TR2 with potentials of the collector C with ambient temperatures as parameters. FIG. 4 indicates temperature characteristics of $V_{BE}$ with collector-emitter potential differences $V_{CE}$ of 0.3 to 10 V.

In the application shown in FIG. 2, the transistor Tr2 is connected in parallel to the transistor Tr1 adapted to control the supply of current to an electric motor 20. That is, the emitters of the transistors Tr1 and Tr2 are connected to a power source B, and the collectors are connected to the input terminal of the motor 20. A constant current, for instance 20 µA, from a current source 30 is supplied to the base of the transistor Tr2. When the transistor Tr2 is operated in the region in which the base-collector potential difference $V_{BC}$ does not change while the collector-emitter potential difference $V_{CE}$ changes, i.e., when the transistor Tr2 is operated in the active region, it may be used as a temperature detecting sensor which is free from variations in collector potential. By measuring the $V_{BE}$ of the temperature detecting transistor Tr2 during the operation of the transistor Tr1, an ambient temperature Ta with respect to the $V_{BE}$ thus measured can be read from FIG. 4. In FIG. 2, the transistors are of PNP type; however, they may be of NPN type as the case may be.

As was described above, the temperature detecting element is formed in the p$^-$ region which constitutes the transistor, and therefore the temperature of the junction of the transistor can be detected directly. Monitoring the temperature of the junction results in an improvement of the follow-up characteristic of the transistor. The temperature detecting element can be formed without modification of the transistor manufacturing process, which contributes to suppression of the rise in manufacturing cost.

What is claimed is:

1. A bipolar transistor comprising:

a substrate having a p$^-$ region formed on a p$^+$ region;

a first n-type diffusion layer formed in said p$^-$ region;

a first $p^+$ diffusion layer formed in said first n-type diffusion layer; and temperature detecting means for detecting a temperature of said bipolar transistor, said temperature detecting means including:
- a temperature detecting transistor having a second n-type diffusion layer formed in said $p^-$ region, said second n-type diffusion layer being separated from said first n-type diffusion layer, and a second $p^+$ diffusion layer formed in said second n-type diffusion layer,
- a constant current source coupled to said second n-type diffusion layer, and
- means for detecting a voltage between said second n-type diffusion layer and said second $p^+$ diffusion layer, said voltage being proportional to said temperature of said bipolar transistor.

2. A bipolar transistor comprising:

a collector region;

a first base region formed in said first collector region;

a first emitter region formed in said first base region; and means for detecting a temperature of said bipolar transistor, said temperature detecting means including:
- a temperature detecting transistor having a second base region formed in said collector region, said second base region being separated from said first base region, and a second emitter region formed in said second base region,
- a constant current source, coupled to said second base region, and
- means for detecting a voltage between said second base region and said second emitter region, said voltage being proportional to said temperature of said bipolar transistor.

3. The bipolar transistor of claim 2, wherein said collector region is a p-type region, said first and second base regions are n-type regions, and said first and second emitter regions are p-type regions.

4. The bipolar transistor of claim 2, wherein said collector region is an n-type region, said first and second base regions are p-type regions, and said first and second emitter regions are n-type regions.

* * * * *